United States Patent [19]
Takahashi et al.

[11] 4,229,705
[45] Oct. 21, 1980

[54] DIFFERENTIAL AMPLIFIERS

[75] Inventors: Susumu Takahashi; Tadaaki Chikashige, both of Tokyo, Japan

[73] Assignee: Sansui Electric Co., Ltd., Tokyo, Japan

[21] Appl. No.: 936,905

[22] Filed: Aug. 25, 1978

[30] Foreign Application Priority Data

Aug. 31, 1977 [JP] Japan ............................. 52/103563

[51] Int. Cl.² ........................... H03F 3/45; H03F 3/04
[52] U.S. Cl. ................................. 330/258; 330/253; 330/255; 330/261
[58] Field of Search .............. 330/146, 252, 253, 255, 330/258, 261, 263, 267, 301

[56] References Cited
U.S. PATENT DOCUMENTS

| | | | |
|---|---|---|---|
| 3,497,824 | 2/1970 | Goordman | 330/258 |
| 3,927,333 | 12/1975 | Furuhashi | 330/263 X |
| 4,015,290 | 3/1977 | Bowers | 360/63 |

*Primary Examiner*—James B. Mullins
*Attorney, Agent, or Firm*—Harris, Kern, Wallen & Tinsley

[57] ABSTRACT

A differential amplifier able to produce differential-mode output signals different from one another in DC voltage level, is formed by connecting a pair of NPN transistors and another pair of PNP transistors so that the emitter electrodes of these four transistors are coupled to one another by a resistive coupling circuit. The resistive coupling circuit is so arranged that the resistance between the emitter electrodes of the NPN transistors is equal to that between the emitter electrodes of the PNP transistors, with the resistances between the emitter electrodes of one of the NPN transistors and of one of the PNP transistors being equal to that between the emitter electrodes of the other NPN transistor and the other PNP transistor. When one of two input signals is applied to the base electrodes of one of the NPN transistors and of one of the PNP transistors, with the other of the input signals applied to the base electrodes of the other NPN and PNP transistors, differential-mode output signals are obtained at the collector electrodes of the NPN transistors and differential-mode output signals of a different DC voltage level are obtained at the collector electrodes of the PNP transistors.

6 Claims, 8 Drawing Figures

DIFFERENTIAL AMPLIFIERS

BACKGROUND OF THE INVENTION

This invention relates to differential amplifiers and, in particular, to transistor differential amplifiers.

A typical known transistor differential amplifier, as shown in FIG. 1 of the drawings, comprises a matched pair of transistors 1 and 2 (NPN transistors are shown). The emitter electrodes of both transistors are directly coupled to one another and are coupled to a negative power source through a common emitter resistor 3. The collector electrodes are coupled to a positive power source through resistors 4 and 5, respectively.

Input signals $e_1$ and $e_2$ are applied to the base electrodes of transistors 1 and 2, respectively, and antiphase or opposite-phase output signals $v_1$ and $v_2$ are obtained from the collector electrodes of the transistors 1 and 2. In case only one of the output signals, for example, the signal $v_1$, is desired in practical use, the collector resistor 5 on the other output side may be omitted.

The differential amplifier of FIG. 1 has a disadvantage that a high common-mode rejection ratio (C.M.R.) is not achieved. When the input signals $e_1$ and $e_2$ are equal to one another in magnitude and phase, the gain of the amplifier or the common-mode gain Gc is given as follows:

$$Gc = \frac{R_4 \times R_5}{R_3(R_4 + R_5)}$$

where $R_3$, $R_4$ and $R_5$ represent resistances of the resistors 3, 4 and 5, respectively. Hence, the common-mode is present in the output signals $v_1$ and $v_2$.

In order to achieve a high C.M.R., it is known to use a constant current source circuit 6 in place of the common emitter resistor 3, as shown in FIG. 2. It is also well known that FET transistors may be used in place of bipolar transistors in differential amplifiers. A transistor differential amplifier has been used as a first stage amplifier in a throughout direct coupled audio frequency amplifier, and also used as a driver in the throughout direct coupled amplifier.

As above described, anti-phase differential-mode signals which are equal to one another in DC level can be obtained in known differential amplifiers. But since antiphase and/or in-phase differential-mode output signals which are different to one another in DC level cannot be obtained, it was impossible to directly drive complementary symmetry circuits to operate as a push-pull amplifier by outputs of the differential amplifier.

Furthermore, since the maximum current flowing through either one transistor is restricted to twice the current at a time when no input signal is applied, due to the common emitter resistor (3, in FIG. 1) or the constant current source circuit (6, in FIG. 2), the high current operation is not possible.

It is desirable that a differential amplifier has the following features:

1. High common-mode rejection ratio (C.M.R.).
2. A circuit operative with the flow of a high current in spite of the application of the low bias current.
3. Two outputs signals which are in-phase.
4. In-phase output signals or opposite-phase output signals having different DC levels.

Another method for improving the C.M.R. of a differential amplifier is disclosed in U.S. Pat. No. 3,497,824. In FIG. 1 of the U.S. Patent, an emitter follower amplifier is coupled to a common junction in the emitter circuit of the emitter-coupled differential amplifier. Other forms of differential amplifiers utilizing four transistors are shown in FIGS. 2-4 of said patent. The C.M.R. of the circuit of FIG. 2 of the U.S. Patent appears to be higher than that of the circuit of FIG. 1, but not so high as desired.

The circuit of FIG. 2 of the U.S. Patent does not have features 3 and 4 set out above.

The circuits shown in FIGS. 3 and 4 of the U.S. patent do not realize a high C.M.R., because the common-mode signals are equivalently grounded at resistors 82 and 83.

Neither of the circuits of FIGS. 3 and 4 of the U.S. patent has the feature 2 set out above. The emitter current of transistors 20 and 21 flows through the resistor 82, and the emitter current of transistors 65 and 66 also flows through the resistor 82. Therefore, it is required that the current corresponding to the peak current which flows through transistors 20, 21, 65, and 66 must be applied to flow from sources 86 and 87 through resistor 83, diode 80 and resistor 82. This means that the use of a greater electric power source is necessary.

The circuit of FIGS. 3 and 4 of the U.S. patent do not have the aforesaid features 3 and 4.

Accordingly, it is an object of this invention to provide a transistor differential amplifier wherein differential-mode output signals which are different to one another in DC level can be obtained.

It is another object of this invention to provide a transistor differential amplifier which is operative without restriction of the current flowing therethrough.

It is a further object of this invention to provide a transistor differential amplifier wherein a high common-mode rejection ratio is achieved.

A specific object of this invention is to provide a transistor differential amplifier which can directly drive a complementary symmetry circuit to operate as a push-pull amplifier.

Further objects and features of this invention will be understood from the following description of preferred embodiments of this invention referring to the annexed drawings.

SUMMARY OF THE INVENTION

A transistor differential amplifier of this invention comprises a matched pair of first and second transistors of a first conductive type and another matched pair of third and fourth transistors of a second conductive type. Carrier extraction electrodes (this electrode is a collector electrode if the transistor is a bipolar transistor, or a drain electrode if it is an FET transistor) of the first and second transistors are coupled to a povitive power line. Carrier extraction electrodes of the third and fourth transistors are coupled to a negative power line. Carrier injection electrodes (this electrode is an emitter electrode if the transistor is a bipolar transistor, or a source electrode if it is an FET transistor) of the first, second, third and fourth transistors are coupled to one another by a resistive coupling circuit.

The resistive coupling circuit is so arranged that the resistance of a circuit path connecting the first and second transistors is equal to the resistance of a circuit path connecting the third and fourth transistors, and the resistance of a circuit path connecting the first and third transistors is equal to the resistance of a circuit path connecting the second and fourth transistors.

As the resistive coupling circuit, a circuit may be used which uses no resistor but only conductive lines, for example, a circuit may be used which directly connects the carrier injection electrodes of the first to fourth transistors to a common connection point.

Control electrodes (this electrode is a base electrode if the transistor is a bipolar transistor, or a gate electrode if it is an FET transistor) of the first and fourth transistors are coupling to one another for commonly receiving an input signal. Control electrodes of the second and third transistors are also coupled to one another for commonly receiving another input signal. Thus, anti-phase differential-mode output signals on a DC positive level can be obtained from the carrier extraction electrodes of the first and second transistors, and similar differential-mode output signals on a DC negative level can be obtained from carrier extraction electrodes of the third and fourth transistors.

DETAILED DESCRIPTION OF PREFERRED EMBODIMENTS

Figure 3:
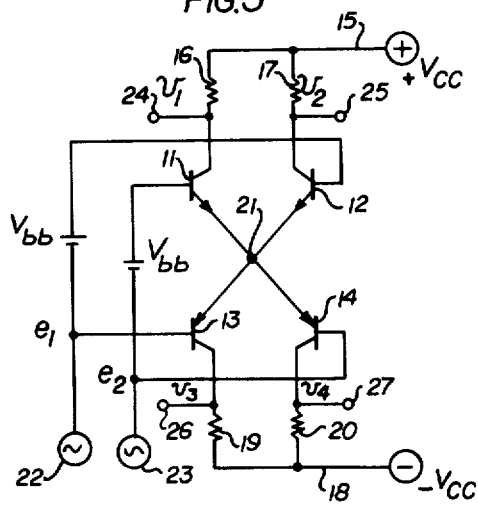
FIG. 3 is a circuit diagram of an embodiment of the present invention.

Referring to FIG. 3, the shown embodiment comprises a matched pair of NPN transistors 11 and 12 and another matched pair of PNP transistors 13 and 14. Collector electrodes of the transistors 11 and 12 are connected to a positive power line 15 through resistors 16 and 17, respectively, and collector electrodes of the transistors 13 and 14 are connected to a negative power line 18 through resistors 19 and 20, respectively. Emitter electrodes of transistors 11-14 are directly coupled to one another through a common connection point 21.

The base electrode of the transistor 13 is coupled to the base electrode of the transistor 12 with a DC potential difference Vbb and also is connected to an input signal source 22. The base electrode of the transistor 14 is coupled to the base electrode of the transistor 11 with a DC potential difference Vbb and also is connected to another input signal source 23.

Output terminals 24-27 are connected to the collector electrodes of the transistors 11-14.

In operation, assuming that differential signals $e_1$ and $e_2$ are applied to the transistors 12 and 11 from the input signal sources 22 and 23, respectively, and that the collector current of the transistor 11 increases while the collector current of the transistor 12 decreases, the collector current of the transistor 13 increases the collector current of the transistor 14 decreases, because the input signals $e_1$ and $e_2$ are also applied to transistors 13 and 14, respectively, and because transistors 13 and 14 are of an opposite conductive type to the transistors 11 and 12. Therefore, the current flowing through resistor 16, transistors 11 and 13, and resistor 19 increases, so that the collector potential of the transistor 11 drops down, with the collector potential of the transistor 13 elevating. Accordingly, output signals $v_1$ and $v_3$ at the output terminals 24 and 26 are out of phase with one another and are different from one another in DC potential level. Also, since the current flowing through resistor 17, transistors 12 and 14, and resistor 20 decreases, the collector potential of the transistor 12 elevates and the collector potential of the transistor 14 drops down. Accordingly, the output signal $v_2$ at the output terminal 25 is out of phase with the output signal $v_4$ at the output terminal 27 and is different from the signal $v_4$ in DC potential level.

It will be readily understood that the two output signals $v_1$ and $v_2$ are out of phase with one another and have a positive DC potential level, and the other two output signals $v_3$ and $v_4$ are also out of phase with one another and have a negative DC potential level.

Accordingly, the transistor differential amplifier shown in FIG. 3 can produce a pair of in-phase output signals which are different in DC potential level and also a pair of anti-phase output signals which are different in DC potential level.

It will be shown below that the maximum current flowing in the amplifier of FIG. 3 is greater than that of previously known differential amplifiers.

It will be understood that the maximum current $I_{max}$ flowing through the transistors 11 and 13 at a time when the anti-phase input signals $e_1$ and $e_2$ are applied is expressed by the following equation:

$$I_{max} = \frac{2\ Vcc}{R_{16} + R_{19}}$$

where $R_{16}$ and $R_{19}$ represent resistance of the resistors 16 and 19, respectively, and Vcc represents the voltage value of each of the positive and negative power sources.

Assuming the $R_{16}=R_{19}=1K\Omega$, Vcc=100v, and that the current I flowing through transistors 11 and 13 at a time when no input signal is applied (or $e_1=e_2=0$) is 0.5 mA, $$I_{max} = \frac{2 \times 100(v)}{1(K\Omega) + 1(K\Omega)} = 100(mA),\ \text{and}$$

$$\frac{I_{max}}{I} = \frac{100}{0.5} = 200.$$

The current I at a time of no input signal is selected by adjusting the DC potential difference Vbb.

Figure 1:
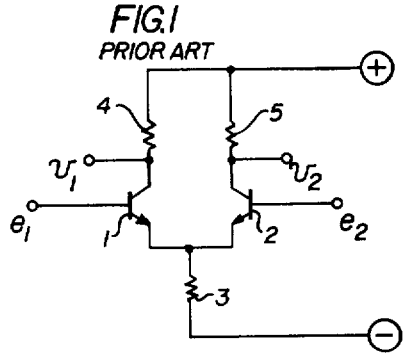
FIG. 1 is a circuit diagram of a known transistor differential amplifier.
Figure 2:
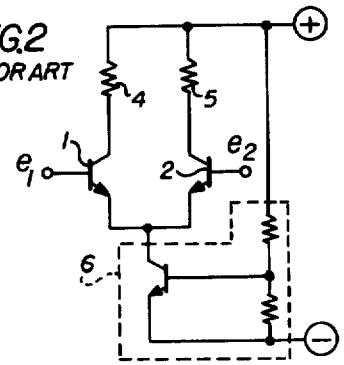
FIG. 2 is a circuit diagram of another known transistor differential amplifier.

On the contrary, the maximum current flowing through the transistor 1 or 2 in the known circuit shown in FIG. 1 or 2 is restricted, due to the existence of the current at a time when no input signal is applied. Accordingly, assuming the current at a time of no input signal is 0.5 mA, the maximum current $I_{max}=1$ mA, namely, $I_{max}/I=1/0.5=2$.

Hence it is seen that the maximum current in the differential circuit shown in FIG. 3 is about 100 times greater than that in differential circuit of FIG. 1. Therefore, the differential circuit shown in FIG. 3 is operative without restriction of the current flowing therethrough, and, therefore, is useful in applications wherein the high current operation is required.

Now, the common-mode rejection ratio (C.M.R.) of the embodiment in FIG. 3 will be described.

Since the emitter electrodes of the pair of transistors 11 and 12 are commonly connected, it will be understood that these two transistors form a differential amplifier. Similarly the other pair of transistors 13 and 14 form a differential amplifier. When the two input signals $e_1$ and $e_2$ are applied to the pair of transistors 11 and 12, the potential at the common connection point of the emitter electrodes thereof is given by $(e_1+e_2)/2$. At a same time, when the two input signals $e_1$ and $e_2$ are applied to the other pair of transistors 13 and 14, the potential at the common connection point of the emitter electrodes of the transistors is also given by $(e_1+e_2)/2$. Since there is no potential difference between the two common connection points, no current flows between the common connection points. This is effectively equivalent to the state that the resistance of the common emitter resistor of each differential amplifier is infinity. Therefore, it will be understood that the C.M.R. of the differential amplifier in FIG. 3 is so high that no common-mode component is present in the output signals.

In the circuit formation of this invention, it will be understood that the two transistors 11 and 13 also form a differential amplifier and that the other two transistors 12 and 14 form a differential amplifier. The operation of these differential amplifiers permits greater current to flow through the collector resistors as has been described hereinbefore.

Figure 4:
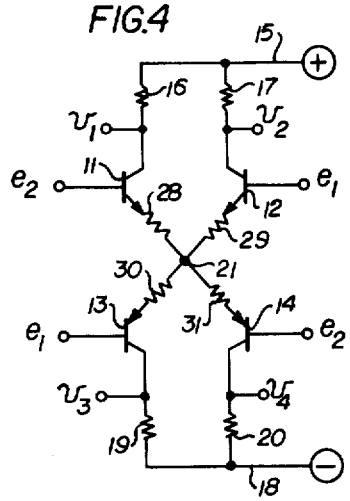
FIGS. 4-6 are circuit diagrams of different embodiments of the present invention.

Referring to FIG. 4, the shown embodiment is a modification of the embodiment in FIG. 3, and is similar to the embodiment in FIG. 3, except that resistors 28–31 are used for coupling the common connection point 21 to the emitter electrodes of the transistors 11–14, respectively. Similar parts in FIG. 4 are represented by the same reference characters as in FIG. 3.

The resistance of these resistors 28–31 are equal to one another. Accordingly, it will be understood that the operation and the performance of this embodiment are substantially similar to those of the embodiment in FIG. 3. Further detailed description of the embodiment will be omitted for the simplification of the description.

Figure 5:
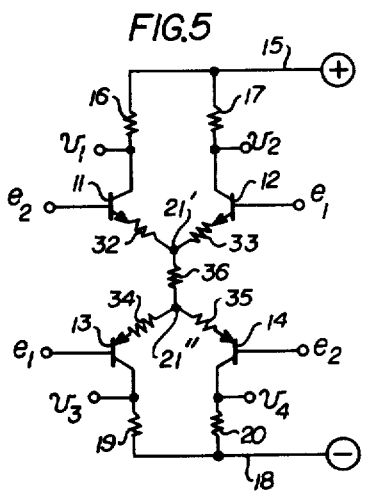

Referring to FIG. 5 which shows another embodiment of this invention, the shown embodiment is a modification of the embodiment in FIG. 4, and is equivalent to a circuit where a common resistor 36 is connected in place of the common connection point 21 in FIG. 4.

Emitter electrodes of the pair of transistors 11 and 12 are connected to one another through resistors 32 and 33, while emitter electrodes of the other pair of transistors 13 and 14 are connected to one another through resistors 34 and 35. These resistors 32–35 have an equal resistance.

The resistor 36 couples between a common connection point 21' of resistors 32 and 33 and another common connection point 21" of resistors 34 and 35. Accordingly, the coupling circuit between the emitters of the four transistors 11–14 is symmetric in relation to a middle point of the common connection resistor 36, and, therefore, it will be noted that the operation and the performance of this embodiment are substantially similar as the previous embodiments. But, since the resistance between the pair of transistors 11 and 12 and the pair of transistors 13 and 14 is greater than the resistance either between the transistors 11 and 12 or between the transistors 13 and 14, the coupling between transistors 11 and 12 or between transistors 13 and 14 is increased so that the distortion may be improved.

Figure 6:
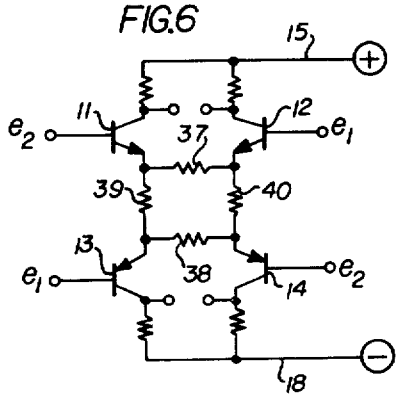

Referring to FIG. 6, the shown embodiment is similar to the previous embodiments except the circuit arrangement for coupling between the emitters of the four transistors. Similar parts are represented by same reference characters as in FIG. 4. The emitter coupling circuit comprises four resistors 37–40. These four resistors 37–40 are connected in series with one another to form an endless closed loop. The common connection points between every adjacent two resistors are coupled to the emitter electrodes of the four transistors 11–14, as shown in FIG. 6.

The resistance of the resistor 37 is equal to that of the resistor 38, and the resistor 39 is selected equal in resistance to the resistor 40.

In operation by applying input signals $e_1$ and $e_2$, when the transistor 11 operates to increase the current flowing therethrough, the transistor 13 also operates to increase the current flowing therethrough, similarly as the circuit in FIG. 3, with the transistors 12 and 14 operating to decrease the current flowing therethrough. Therefore, the operation and the performance of this embodiment are similar as that of FIG. 3, FIG. 4 or FIG. 5.

According to this invention, since a differential amplifier can be obtained which produce anti-phase and/or in-phase differential-mode output signals which are different in DC potential level, it is possible with less distortion to directly drive a complementary symmetry circuit as a push-pull amplifier. Furthermore, since the differential amplifier of this invention can be operated by the greater driving current, it is possible to use transistors which are small in the size, low in the cost and superior in the high-frequency response.

Audio frequency amplifiers using the differential amplifier of this invention will be disclosed.

Figure 7:
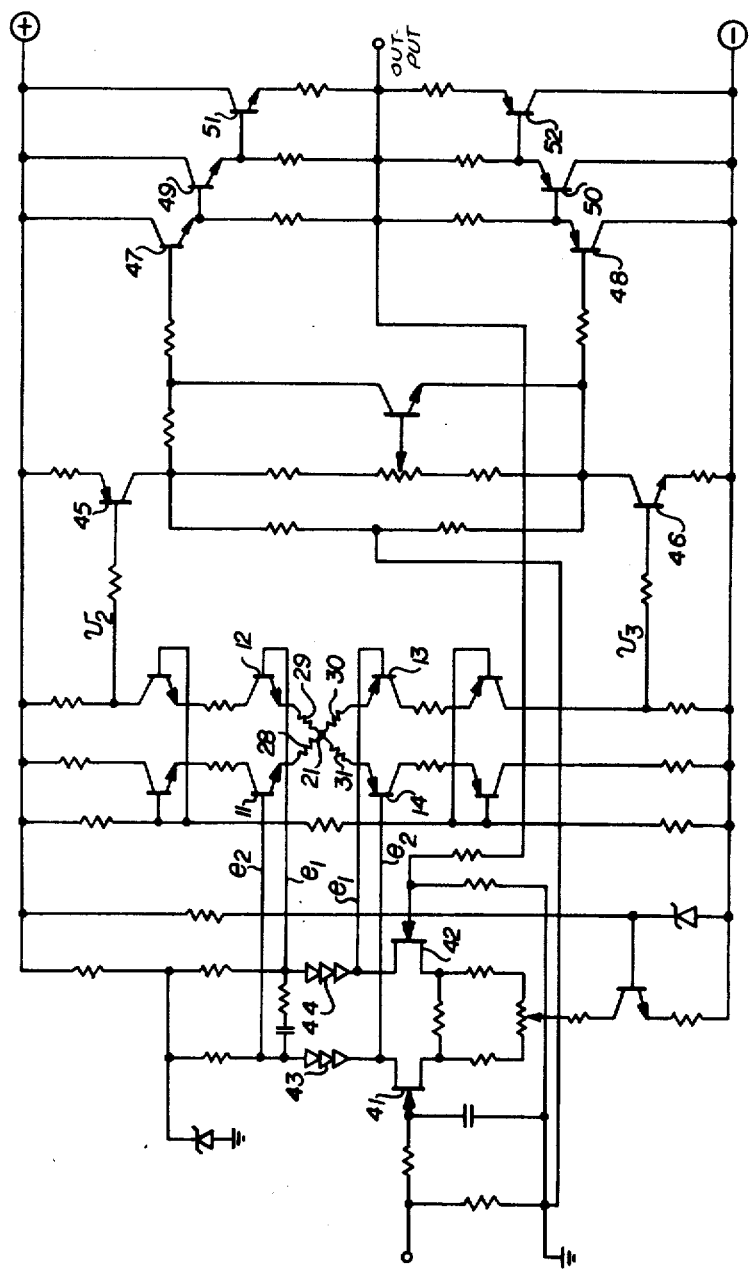
FIG. 7 is a circuit diagram of a direct coupled amplifier using the circuit of FIG. 4.

Referring to FIG. 7, the differential circuit shown in FIG. 4 is used as a second stage and is shown with same reference characters. The input signals $e_1$ and $e_2$ to the differential amplifier are supplied from a first stage differential amplifier comprising FET transistors 41 and 42. Diodes 43 and 44 are for producing the DC potential difference Vbb described in FIG. 3.

Two in-phase differential-mode signals $v_2$ and $v_3$ are coupled to the base electrodes of PNP transistor 45 and NPN transistor 46, respectively, to directly drive the transistors. Thus, the complementary symmetry circuit of the transistors 45 and 46 is driven as a push-pull amplifier by outputs from the second differential amplifier. The transistors 47–52 form emitter followers using a Darlington connection, from which the amplified audio output is obtained.

Figure 8:
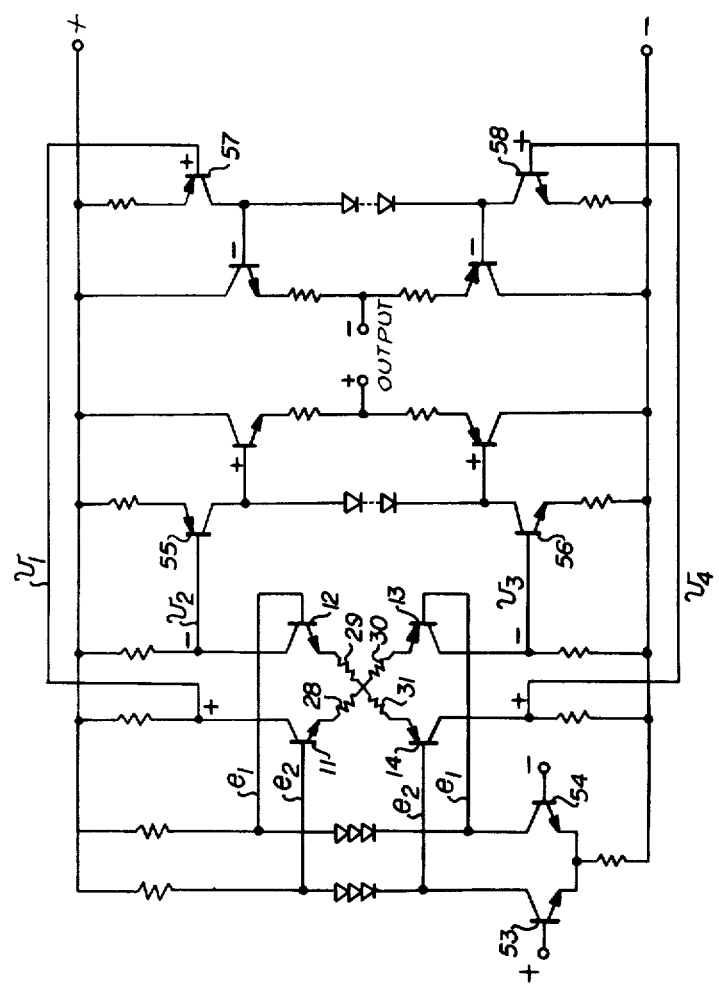
FIG. 8 is a circuit diagram of a balanced transformerless amplifier using the circuit of FIG. 4.

Referring to FIG. 8, the circuit in FIG. 4 is used as a second stage amplifier in a balanced transformerless amplifier, and is shown with same reference characters. The input signals $e_1$ and $e_2$ are also supplied from a first stage differential amplifier comprising transistors 53 and 54.

Two in-phase signals $v_2$ and $v_3$, which are different from one another in DC potential level, are used to directly drive a complementary symmetry circuit comprising transistors 55 and 56. Similarly, other in-phase signals $v_1$ and $V_4$, which are out of phase from the signals $v_2$ and $v_3$, are used to drive another complementary symmetry circuit comprising transistors 57 and 58. Thus, the balanced transformerless amplifier is realized in a simple circuit formation.

Embodiments of the invention have been described in detail using bipolar transistors but it will be understood by those skilled in the art that the differential amplifier of this invention can be similarly made using FET transistors. Also, inverted Darlington connections may be used in place of single transistors.

In the differential amplifier of this invention, if certain one or ones of the four outputs $v_1$–$v_4$ are not used, corresponding collector resistors may be omitted.

Applications of the differential amplifier of this invention to audio frequency amplifiers have been described, but it will be easily understood that the differential amplifier of this invention can be used in various applications wherein it is desired to obtain output signals of different DC levels from a differential amplifier.

What is claimed is:

1. A transistor differential amplifier comprising:

first and second transistors of a first conductive type;

third and fourth transistors of a second conductive type, each of said first, second, third and fourth transistors having carrier extraction, carrier injection and control electrodes;

first means for coupling a first electric power supply line to a carrier extraction electrode of each of said first and second transistors;

second means for coupling a second electric power supply line to a carrier extraction electrode of each of said third and fourth transistors;

an electrical resistive coupling circuit connected between said carrier injection electrodes of said first, second, third and fourth transistors wherein the resistance of a circuit path between said first and second transistors is equal to the resistance of a circuit path between said third and fourth transistors, and the resistance of a circuit path between said first and third transistors is equal to the resistance of a circuit path connecting between said second and fourth transistors, said resistive coupling circuit comprising four resistors connected to a common connection point and connected to said carrier injection electrodes of first to fourth transistors, respectively;

input signal applying circuits coupled with said control electrodes of said first, second, third and fourth transistors; and at least two output terminals, with one of said output terminals connected to said carrier extraction electrode of said first transistor and the other of said output terminals connected to said carrier extraction electrode of one of said third and fourth transistors whereby a differential signal may be obtained at said output terminals with different DC levels.

2. The transistor differential amplifier as defined in claim 1, wherein said input signal applying circuits include two input terminals and connecting circuits for coupling one of said two input terminals to said control electrodes of said first and fourth transistors and for coupling the other of said input terminals to said control electrodes of said second and third transistors.

3. A transistor differential amplifier comprising:

first and second transistors of a first conductive type;

third and fourth transistors of a second conductive type, each of said first, second, third and fourth transistors having carrier extraction, carrier injection and control electrodes;

first means for coupling a first electric power supply line to a carrier extraction electrode of each of said first and second transistors;

second means for coupling a second electric power supply line to a carrier extraction electrode of each of said third and fourth transistors;

an electrical resistive coupling circuit connected between said carrier injection electrodes of said first, second, third and fourth transistors wherein the resistance of a circuit path between said first and second transistors is equal to the resistance of a circuit path between said third and fourth transistors, and the resistance of a circuit path between said first and third transistors is equal to the resistance of a circuit path connecting between said second and fourth transistors, said resistive coupling circuit comprising five resistors, with two of said five resistors connected in series with one another at a first point and between said carrier injection electrodes of said first and second transistors, and with another two resistors of said five resistors connected in series with one another at a second point and between said carrier injection electrodes of said third and fourth transistors, and with the other of said five resistors connected between said first and second points;

input signal applying circuits coupled with said control electrodes of said first, second, third and fourth transistors; and at least two output terminals, with one of said output terminals connected to said carrier extraction electrode of said first transistor and the other of said output terminals connected to said carrier extraction electrode of one of said third and fourth transistors whereby a differential signal may be obtained at said output terminals with different DC levels.

4. The transistor differential amplifier as defined in claim 3, wherein said input signal applying circuits include two input terminals and connecting circuits for coupling one of said two input terminals to said control electrodes of said first and fourth transistors and for coupling the other of said input terminals to said control electrodes of said second and third transistors.

5. A transistor differential amplifier comprising:

first and second transistors of a first conductive type;

third and fourth transistors of a second conductive type, each of said first, second, third and fourth transistors having carrier extraction, carrier injection and control electrodes;

first means for coupling a first electric power supply line to a carrier extraction electrode of each of said first and second transistors;

second means for coupling a second electric power supply line to a carrier extraction electrode of each of said third and fourth transistors;

An electrical resistive coupling circuit connected between said carrier injection electrodes of said first, second, third and fourth transistors wherein the resistance of a circuit path between said first and second transistors is equal to the resistance of a circuit path between said third and fourth transistors, and the resistance of a circuit path between said first and third transistors is equal to the resistance of a circuit path connecting between said second and fourth transistors, said resistive coupling circuit comprising four resistors, with one of said four resistors connected between said carrier injection electrodes of said first and second transistors, and with another of said four resistors connected between said carrier injection electrodes of said third and fourth transistors, and with another of said four resistors coupled between said carrier injection electrodes of said first and third transistors, and with the other of said four resistors connected between said carrier injection electrodes of said second and fourth transistors;

input signal applying circuits coupled with said control electrodes of said first, second, third and fourth transistors; and at least two output terminals, with one of said output terminals connected to said carrier extraction electrode of said first transistor and the other of said output terminals connected to said carrier extraction electrode of one of said third and fourth transistors whereby a differential signal may be obtained at said output terminals with different DC levels.

6. The transistor differential amplifier as defined in claim 5, wherein said input signal applying circuits include two input terminals and connecting circuits for coupling one of said two input terminals to said control electrodes of said first and fourth transistors and for coupling the other of said input terminals to said control electrodes of said second and third transistors.

* * * * *